United States Patent
Tanaka

(10) Patent No.: US 6,476,654 B2
(45) Date of Patent: Nov. 5, 2002

(54) SLEW RATE ADJUSTING CIRCUIT

(75) Inventor: Kenichi Tanaka, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/904,283

(22) Filed: Jul. 12, 2001

(65) Prior Publication Data

US 2002/0005743 A1 Jan. 17, 2002

(30) Foreign Application Priority Data

Jul. 13, 2000 (JP) ........................................ 2000-212317

(51) Int. Cl.[7] .................................................. H03K 5/12
(52) U.S. Cl. ...................................... 327/170; 327/134
(58) Field of Search .............................. 327/170, 108, 327/112, 134, 261, 263, 264, 284, 285, 398, 399; 326/37, 38, 82, 83, 86, 87

(56) References Cited

U.S. PATENT DOCUMENTS 5,355,029 A * 10/1994 Houghton et al. ............. 326/26
5,568,081 A * 10/1996 Lui et al. ...................... 327/380
5,949,249 A * 9/1999 Preuss et al. .................. 326/27
6,081,134 A * 6/2000 Labram ......................... 326/83
6,181,176 B1 * 1/2001 Nakano ........................ 327/170
6,229,336 B1 * 5/2001 Felton et al. .................. 326/38
6,307,414 B1 * 10/2001 Hoff ............................ 327/170

FOREIGN PATENT DOCUMENTS

JP         11-274909      10/1999      ....... H03K/19/0175

OTHER PUBLICATIONS

Lau B. et al "A 2.6 GB/s Multi–Purpose Chip–to–Chip Interface", Solid State Circuit, vol. 33, No. 11, Nov. 1998.

* cited by examiner

Primary Examiner—Timothy P. Callahan
Assistant Examiner—Hai L. Nguyen
(74) Attorney, Agent, or Firm—Hayes Soloway PC

(57) ABSTRACT

An interface circuit includes a slew rate control unit 110, a pre buffer unit 120, and a main buffer unit 130. The slew rate control unit 110 is configured as a current source circuit of the pre buffer unit 120. The slew rate control unit 110 provides a constant current value by using a loop circuit which consists of a slew rate control macro 111, a decoder 112, a comparator 113, N transistor 114, an external terminal resistance (Rref) 115, and a reference voltage (Vref) 116. A size of the N transistor 114 is adjusted based on a code gradually changed in the loop circuit, and finally the current value is determined uniquely.

5 Claims, 5 Drawing Sheets

SLEW RATE ADJUSTING CIRCUIT

BACKGROUND OF THE INVENTION

1. Field of the Invention

The invention relates to an interface circuit which can automatically (or autonomously) adjust a slew rate into a predetermined value established by an external terminal resistance, regardless of conditions including a process condition.

2. Description of the Related Art

Adjusting a slew rate of an output signal of an interface circuit is important to solve a problem of signal reflection which is caused to occur in connection with the interface circuit. A technology related to the problem has been developed.

A slew rate detector which can adjust a slew rate in an interface circuit is proposed in an article (FIG. 7) "A 2.6 GBYTE/s Multipurpose Chip-to-Chip Interface", SOLID-STATE CIRCUIT, Vol. 33, No. 11, November 1998.

The proposed slew rate detector provides a reference clock to a slew rate control logic and starts to search a process condition and other environmental conditions in response to a trigger signal. Specifically, the slew rate detector detects output signals at two points after a signal is entered to an NMOS Delay Chain, and the detected signals are provided to a flip-flop circuit (FF) at a timing defined by a sample clock. Then, the detector searches a process condition and other environmental conditions by calculating a differential delay between the signals, and generates a slew rate code corresponding to the searched conditions.

As described above, conventional interface circuits generally search a process condition and other environmental conditions, and generate a slew rate code according to the searched conditions. This means that the slew rate code inevitably depends on the searched conditions. Therefore, there is no conventional interface circuit which can determine and generate a slew rate code independent of these conditions. In other words, a positive decision of a slew rate has not been made in any conventional circuit.

SUMMARY OF THE INVENTION

It is, therefore, an object of the invention to provide an interface circuit which determines a slew rate according to a current value of a current source established by an external terminal resistance, independently of conditions including a process condition.

It is another object of the invention to provide an interface circuit which automatically adjusts an initial rise time and an initial rise voltage of an output signal, after adjustment of an impedance and a slew rate.

According to a first aspect of the invention, there is provided a slew rate adjusting circuit comprising a pre buffer unit which receives an input signal, a slew rate control unit which determines a current value of a current supplied to the pre buffer unit and automatically controls a slew rate of the input signal, and a main buffer unit which receives the input signal from the pre buffer unit and, in response to receiving of the input signal, outputs an interface output with a slew rate controlled by the slew rate control unit.

According to a second aspect of the invention, there is provided a method of adjusting a slew rate between an input signal and an output signal. The method comprises the steps of variably controlling a value of a drive current by using a relationship between the value of the drive current and the slew rate, and adjusting the slew rate based on the value of the drive current.

According to a third aspect of the invention, there is provided a method of adjusting a slew rate comprising the steps of receiving, at a pre buffer unit, an input signal, determining a current value of a current provided to the pre buffer unit and automatically controlling a slew rate of the input signal, and receiving the input signal from the pre buffer unit, and outputting an interface output at the controlled slew rate in response to inputting of the input signal.

According to a fourth aspect of the invention, there is provided a recording medium readable by a computer, tangibly embodying a program of instructions executable by the computer to perform a method of adjusting a slew rate comprising the steps of receiving, at a pre buffer unit, an input signal, determining a current value of a current provided to the pre buffer unit and automatically controlling a slew rate of the input signal, and receiving the input signal from the pre buffer unit, and outputting an interface output at the controlled slew rate in response to inputting of the input signal.

According to a fifth aspect of the invention, there is provided a computer data signal embodied in a carrier wave and representing a sequence of instructions which, when executed by a processor, cause the processor to perform a method of adjusting a slew rate comprising the steps of receiving, at a pre buffer unit, an input signal, determining a current value of a current provided to the pre buffer unit and automatically controlling a slew rate of the input signal, and receiving the input signal from the pre buffer unit, and outputting an interface output at the controlled slew rate in response to inputting of the input signal.

DESCRIPTION OF THE PREFERRED EMBODIMENT

Figure 1:
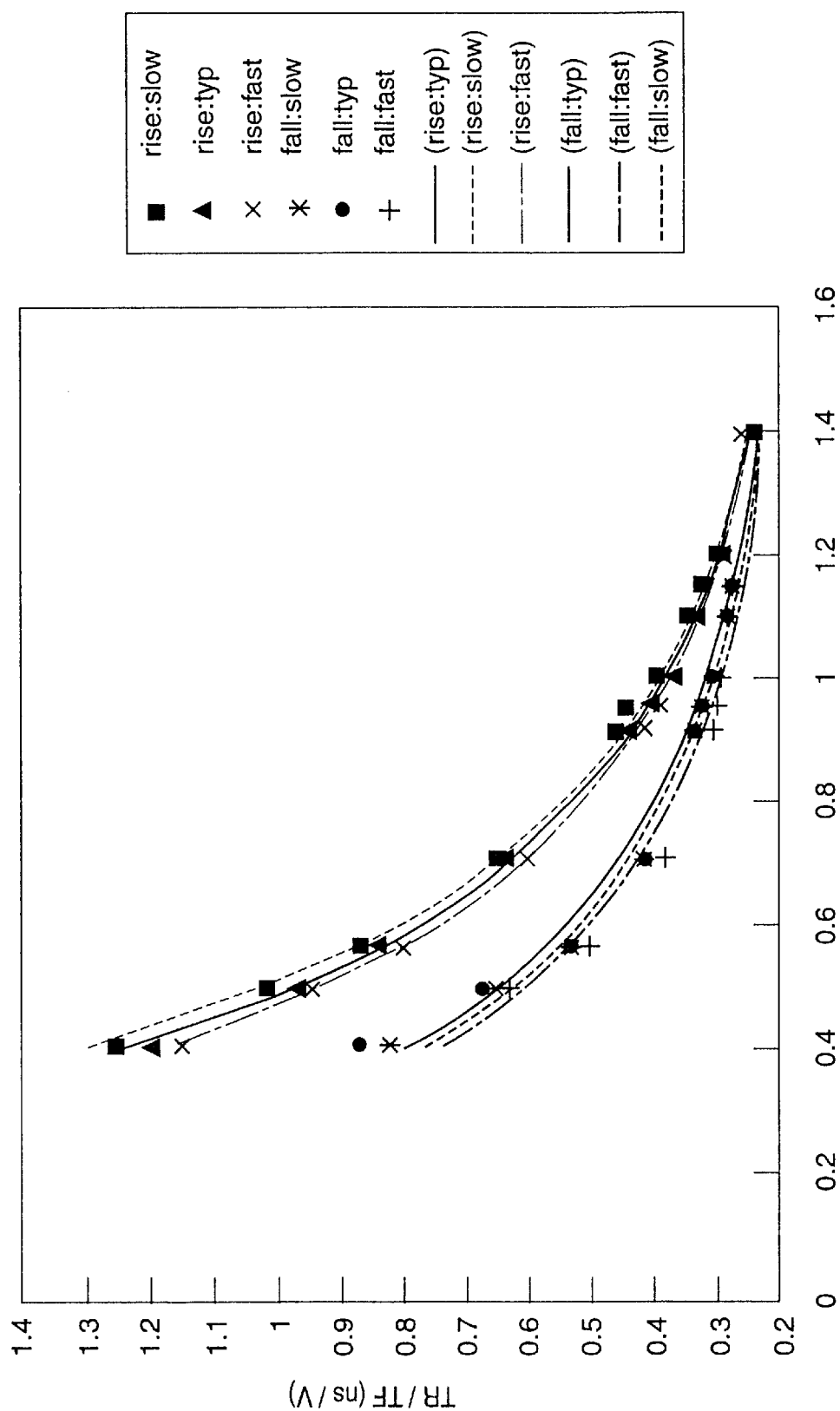
FIG. 1 shows a graph representing a relationship between a slew rate and a current value.

At first, description is made about a relationship between a rise/fall time and a control current value with reference to FIG. 1.

Specifically, FIG. 1 shows a relationship, sampled by a simulation, between a rise time (TR) of an output buffer or a fall time (TF), and a control current value. The rise time means a duration when a voltage of a signal changes from 20% of an amplitude of the signal to 80% of the amplitude. On the other hand, the fall time means a duration when a voltage of a signal changes from 80% of an amplitude of the signal to 20% of the amplitude. Herein, these values are referred to as "a slew rate".

The x axis of the graph shown in FIG. 1 is a current value of a current source and the y axis of the graph is an output rise time or fall time (slew rates). Data related to the rise time and the fall time are each plotted and the data are displayed under some conditions, that is, slow condition, fast condition, and typical condition.

It is found out from the graph that there is a correlation between the current value (x axis) and the slew rate (y axis). And it is also found that if a constant current value is provided, an output slew rate falls between the slew rate of the fast condition and the slew rate of the slow condition, regardless of environmental conditions. That is, it is found that a single output slew rate can be determined if a single current value of the current source (an external terminal resistance value) is determined.

An interface circuit of the invention makes use of the result of the simulation.

Figure 2:
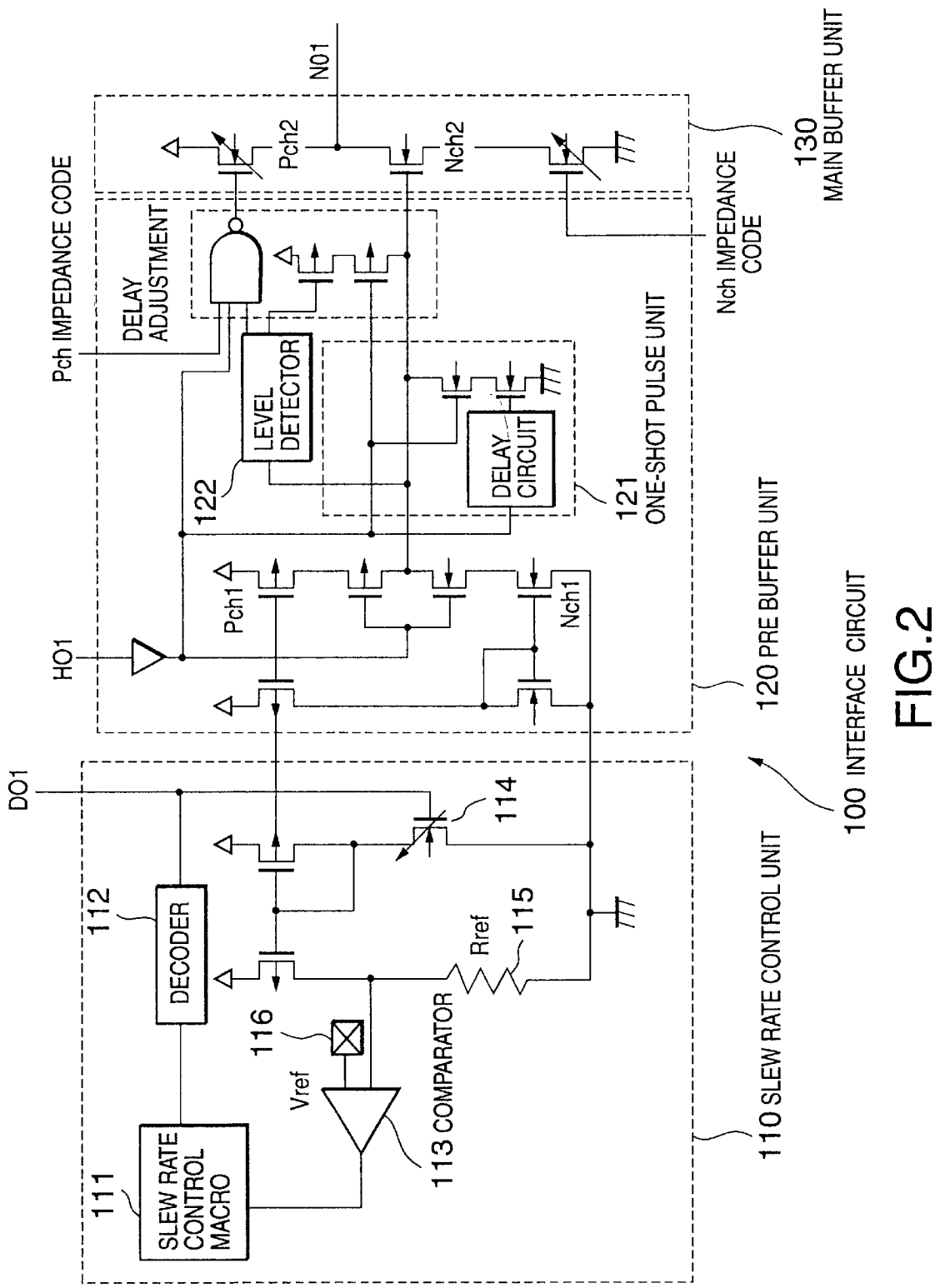
FIG. 2 shows a block diagram representing structure of an interface circuit 100 according to a first embodiment of the invention.

Next, description is made about an interface circuit according to a first embodiment of the invention with reference to FIG. 2. The interface circuit 100 is a GTL+ interface having a slew rate controlling circuit (slew rate control unit 110) according to the invention.

GTL+ (Gunning Transceiver Logic Plus) is a technology to realize an input/output interface between semiconductor devices. In general, the technology is used in a processor which works in a high frequency and low voltage, or processors configured in SMP (Symmetrical Multi-Processing).

The interface circuit 100 shown in FIG. 2 includes a slew rate control unit 110, a pre buffer unit 120, and a main buffer unit 130. In the interface circuit 100, an output signal D01 is provided from the slew rate control unit 110, an input signal H01 is entered into the pre buffer unit 120, and the main buffer unit 130 outputs an output signal N01.

A slew rate of the output signal N01 depends on a slew rate of the pre buffer unit 120. According to the result of the simulation shown in FIG. 1, if the pre buffer unit 120 is configured as a current driven unit and a current value of a current source is determined as a constant value, the slew rate of the pre buffer unit 120 is determined as a unique value independently of environmental conditions including a process condition. In the embodiment, the slew rate control unit 110 including a mirror circuit is arranged as a current source circuit of the pre buffer unit 120.

The slew rate control unit 110 includes a loop circuit which serves to automatically (or autonomously) adjust a slew rate. The loop circuit consists of a slew rate control macro 111, a decoder 112, a comparator 113, N transistor 114, an external terminal resistance (Rref) 115, and a reference voltage (Vref) 116.

The slew rate control unit 110 prepares the external terminal resistance (Rref) 115 to convert a current value at an initial setting into a voltage value, and compares the converted voltage value with the reference voltage (Vref) using the comparator 113.

The slew rate control macro 111 determines whether a slew rate code is to be increased or decreased based on the result of the comparison and automatically generates the slew rate code with reference to a result of decision. The slew rate code is used to change a size of the N transistor 114 which controls the current value of the current source. Herein, the slew rate code corresponds to a W size (namely, a width size) of the N transistor. Specifically, the N transistor 114 is capable of changing a width of a diffusion layer to control a current passing through the transistor.

Then, an output signal (four bits code) from the slew rate control macro 111 is supplied to the decoder 112 and transformed to 16 bits code. Thereafter, the transformed output signal is supplied to a gate of the N transistor 114, which works as a current source of the interface circuit.

Repetition of the above mentioned operations gives a current value of a current source having a voltage level Vref at the comparator, independently of environmental conditions including a process condition.

Figure 3:
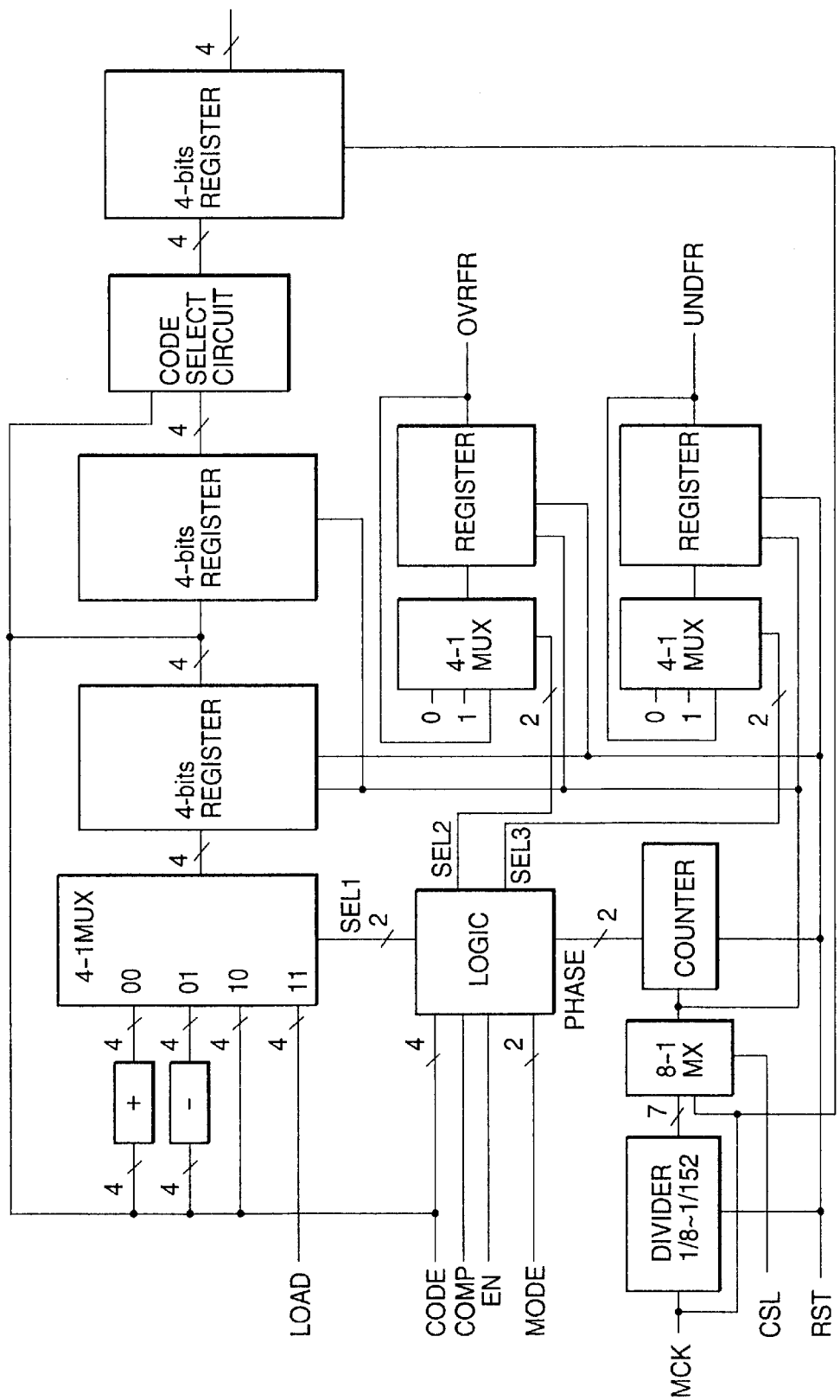
FIG. 3 shows a block diagram representing structure of a slew rate control macro.

Next, description is made about operations of the slew rate control macro 111 with reference to FIG. 3.

The slew rate control macro 111 frequency divides a clock signal from an MCK, and counts the divided signal by a counter to generate four states. In the four states, a state which controls a slew rate and another state (code holding state) are included.

Next, as described above, the result of comparison between a voltage drop at the external terminal resistance (Rref) and the reference voltage (Vref) is entered into a COMP. An operation to be performed about a slew rate is decided based on a value of the COMP and a value of the counter described above.

The operation is selected from three candidate operations, that is, increasing the slew rate code (selecting an increment operation at a 4-1 multiplexer), decreasing the slew rate code (selecting a decrement operation at the 4-1 multiplexer), or holding the current slew rate code (selecting a register loop back signal at the 4-1 multiplexer).

In the case where the slew rate is adjusted, a code is supplied form the 4-1 multiplexer to two stages of four bits registers. Therefore, a current code is stored in one of the registers and a previous code (one clock before) is stored in the other register. Then, a code select circuit selects a smaller code among the codes stored in the register, and stores the selected code into a four bits register located in the last stage. The code is then entered into the counter to remove a glitch noise.

The selection finally means a comparison between the reference voltage (Vref) of the comparator 113 and a resistance voltage resulting from a current generated based on the N transistor's size which is adjusted by a slew rate code from the macro 111. Therefore, the comparator 113 alternately outputs a signal "0" and "1" until a predetermined voltage of current is received, but a value of the code finally becomes a unique value since a smaller code is selected in the code select circuit and the selected code is stored.

After the select operation mentioned above is repeated some times, a slew rate code which is determined as a unique value is provided to an input CODE synchronously with an internal clock.

The code is then provided to the decoder 112 in the interface circuit 100.

Thus adjusted current and N/P control voltage corresponding to the current are provided to an N transistor (depicted by Nch1) and a P transistor (Pch1) in the pre buffer unit 120. Thereby, an inverter to which the external input signal H01 is entered is controlled. As a result, an input gradient of the main buffer 130 is controlled and a slew rate of an interface output (N01) is controlled.

Therefore, if a constant current value of a current source is provided from the slew rate control unit 110, slew rates of rise/fall of gate inputs of the main buffer 130 are uniquely determined and consequently slew rate of rise/fall of the interface output (N01) is uniquely determined.

Also, the slew rate code is provided from an output D01 to another buffer. In the example illustrated in FIG. 2, although a code which is decoded into 16 bits is distributed by the decoder 112, a code can be distributed before the code is decoded.

As described above, a current value of a current source is established based on an external terminal resistance (Rref)

115 independently of environmental conditions, and a slew rate corresponding to the current value can be automatically obtained.

Also, in the interface circuit according to the invention, a signal wave form setting circuit is equipped which serves to remove correlation between the a slew rate and a transport delay. The signal wave form setting circuit is, for example, a circuit which generates a stepped wave, as disclosed in Japanese Laid Open Publication No. H11-274909.

The interface circuit of the invention also generates an initial rise logic at a one-shot pulse unit 121 before a slew rate is adjusted based on a current value, and establishes a switching initial operation which does not closely relate to the slew rate. The interface circuit further monitors a gate voltage of an N transistor (Nch 2) at a level detector 122, and controls a P/N buffer to start driving at a rise/fall timing when the gate voltage reaches a predetermined threshold value. Thereby, a stepped wave can be generated which has not always a large transport delay even if a slew rate is large.

Figure 4:
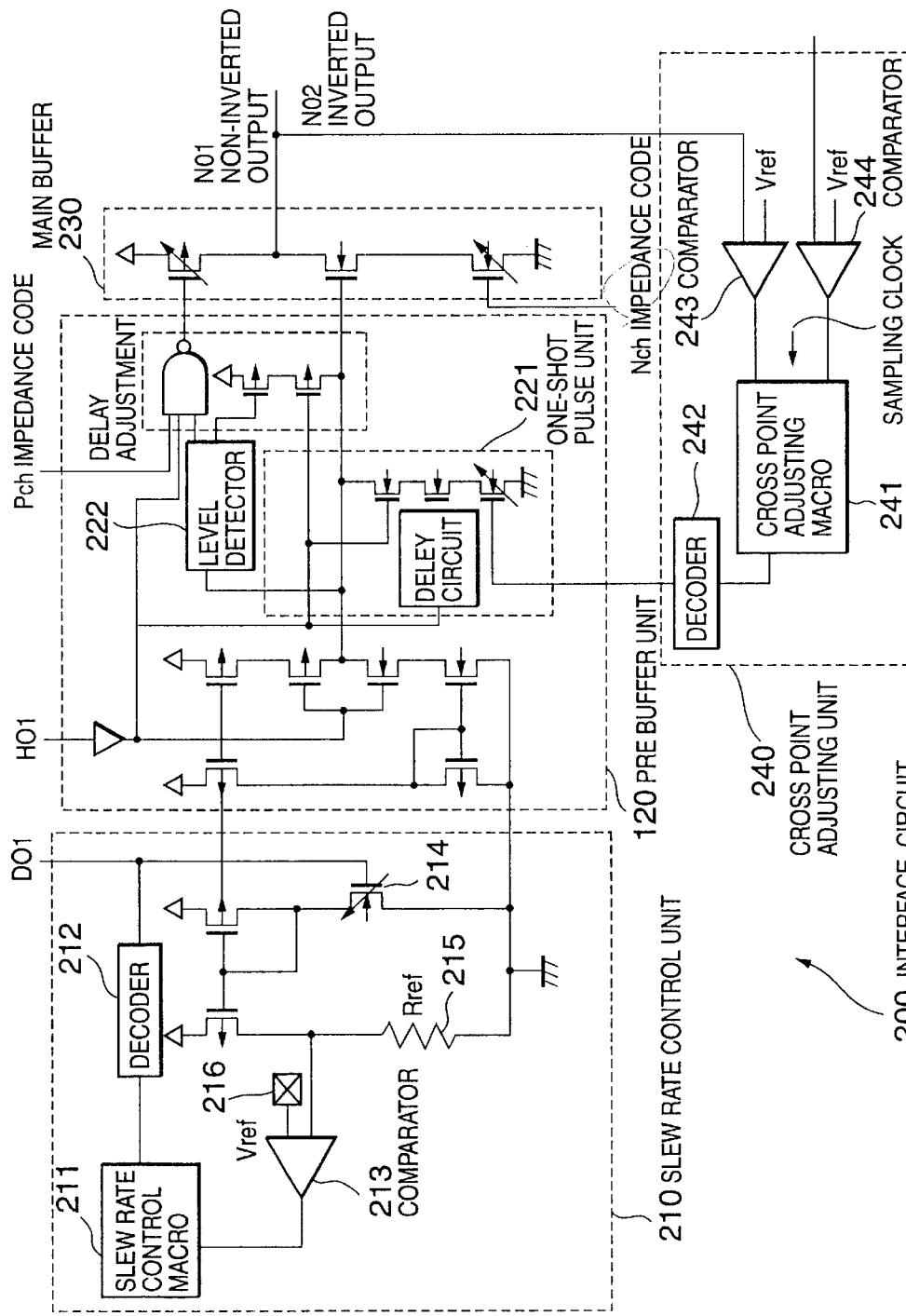
FIG. 4 shows a block diagram representing structure of an interface circuit 200 according to a second embodiment of the invention.

Next, description is made about an interface circuit according to a second embodiment of the invention with reference to FIG. 4.

In FIG. 4, the interface circuit 200 according to the invention is structured by a GTL+ interface having a slew rate controlling circuit (namely, slew rate control unit) and a cross point adjusting circuit (namely, one-shot pulse cross point adjusting unit).

Specifically, the interface circuit 200 includes a slew rate control unit depicted by 210, a pre buffer unit 220, a main buffer unit 230, and the cross point adjusting unit depicted by 240. An external output D01 is provided from the slew rate control unit 210, an external input H01 is entered into the pre buffer unit 220, and an inverted output N02 and a non-inverted output N01 are provided from the main buffer unit 210.

Description about the slew rate control unit 210 is omitted since its structure is similar to that of the slew rate control unit 110 shown in FIG. 2.

Also, the cross point adjusting unit 240 includes a cross point adjusting macro 241, a decoder 242, and two comparators 243, 244.

The non-inverted output N01 and the inverted output N02 of the interface circuit 200 are entered into the comparators 243 and 244, respectively. Thereafter, results of the comparisons are entered into the cross point adjusting macro 241. An output (cross point code) of the cross point adjusting macro 241 is supplied to the decoder 242 and decoded from four bits code to 16 bits code. After that, the decoded code is provided to a gate of an N transistor which controls an initial rise of an interface output. As described above, a loop circuit is configured.

Herein, the inverted output N02 is a signal when the non-inverted output N01 is inverted. A cross point means a position where the non-inverted output N01 crosses the inverted output N02.

In a differential output interface, even if a slew rate of rise signal balances with a slew rate of fall signal, a cross point is located at a offset position if a time of signal transition is different between the two signals.

In the interface circuit 200, a size-variable N transistor is inserted in an N transistor unit in series to change an on-resistance and, as a result, an initial rise time and an initial rise voltage are adjusted by the change of the on-resistance and the cross point can be adjusted.

Next, description is made about operations of the cross point adjusting unit 240 in more detail.

At first, when an impedance and a slew rate are adjusted, it is assumed that differential outputs are changed, and the differential outputs (N01, N02) are entered into the comparators (243, 244). Specifically, the comparator 243 is given the reference voltage (Vref) and the differential output (non-inverted output N01) while the comparator 244 is given the reference voltage (Vref) and the differential output (inverted output N02). The comparators are required to have a high comparison precision, a small offset, and a quick response characteristic.

Next, the outputs of the two comparators 243 and 244 are entered into a cross point adjusting macro 241.

Figure 5:
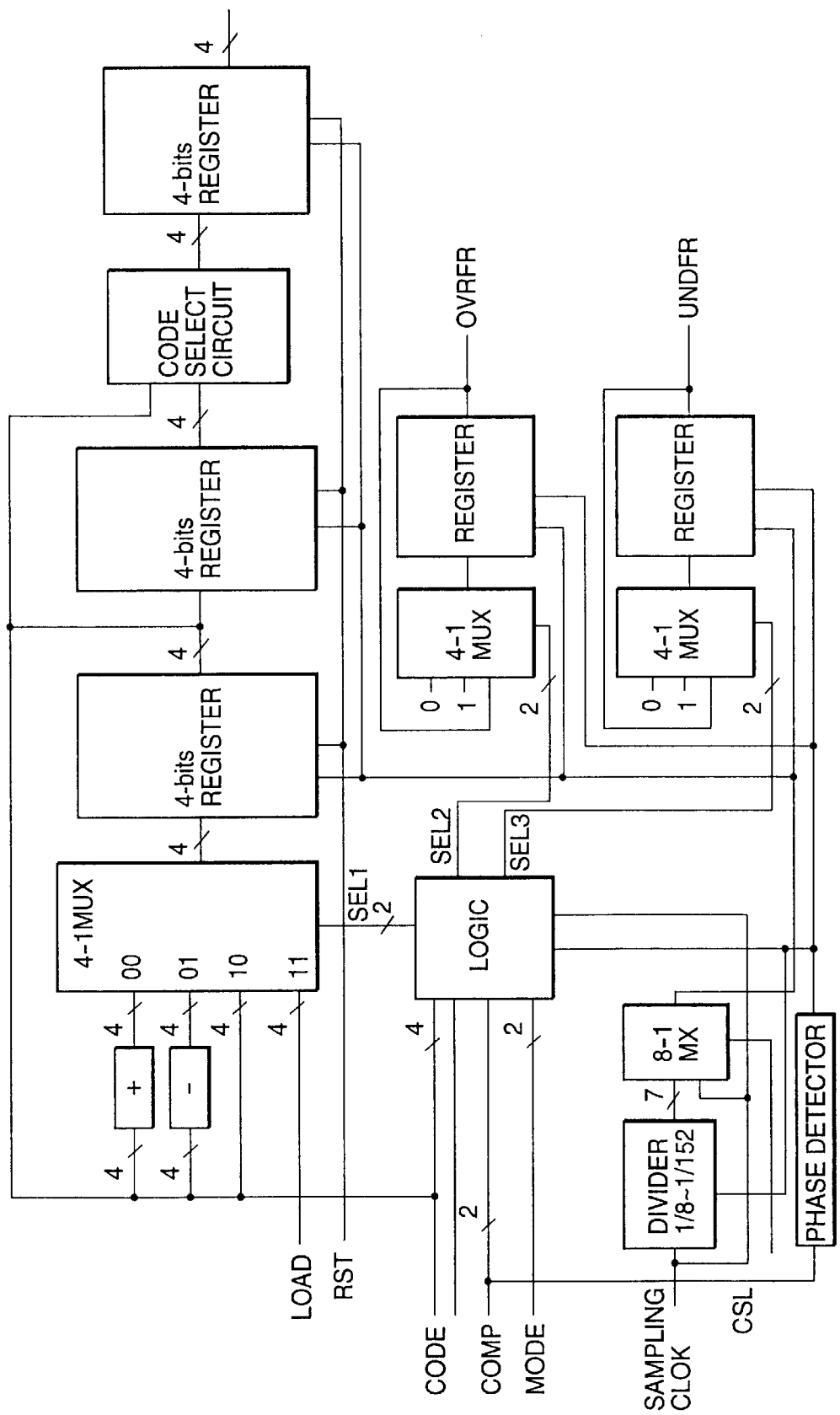
FIG. 5 shows a block diagram representing structure of a cross point adjusting macro.

Then, description is made about operations of the cross point adjusting macro 241 with reference to FIG. 5. The outputs of the comparators 243 and 244 are supplied to an input COMP of the cross point adjusting macro 241. Next, the cross point adjusting macro 241 detects a phase difference (offset of cross points) by a built-in phase detector and transforms the phase difference to a pulse signal. Then, the cross point adjusting macro 241 activates a flip flop circuit (FF) by a sampling clock in a time period corresponding to a pulse duration of the pulse signal, and generates a logic to determine whether a leading edge of an interface output is delayed or not. Next, fixed four bits of code are automatically produced by repeating increment or decrement of the code based on the logic. An N transistor controls a time of initial rise time and voltage of the interface output, and to control them, a size of the transistor is selected by the four bits of code.

The four bits code is then provided to the decoder 242 (shown in FIG. 4), and is decoded to a 16 bits code to be entered to a gate of the N transistor. A cross point is adjusted by repeating the above mentioned feedback operation.

Also, the cross point adjusting macro 241 holds the current code and the previous code which is obtained immediately before the current code in a resister, and compares the codes to output a smaller one of the codes. Therefore, the output code is automatically fixed after the cross point is adjusted.

Next, description is made about a third embodiment of the invention. In the first embodiment of the invention, a replica buffer, such as a slew rate control unit, is used to generate a slew rate code, and the slew rate is distributed to each buffer via an output D01.

On the contrary, in the third embodiment, for each buffer, a slew rate control unit is arranged. This is because the structure is desirable when operating frequencies of the buffers are different from each other or desirable in view of operations of a device.

In a fourth embodiment of the invention, a slew rate control unit and a cross point adjusting unit are arranged for each buffer, and slew rate and a cross point are individually adjusted for each buffer. Although in the second embodiment of the invention, a cross point code is obtained from a resister output and the code is provided to outside, the structure of the fourth embodiment may be desirable when operating frequencies of the buffers are different from each other or desirable in view of operations of a device.

According to the interface circuit of the invention, a current value of current source is established only by an external terminal resistance independently of a process condition and other environmental conditions, and a slew rate is fixedly determined based on the established current value.

Also, according to the interface of the invention, it is possible to automatically adjust an initial rise time and an initial rise voltage of an interface output after adjustment of an impedance and a slew rate.

What is claimed is:

1. A slew rate adjusting circuit comprising:

a pre buffer unit which receives an input signal;

a slew rate control unit which determines a current value of a current supplied to the pre buffer unit and automatically controls a slew rate of the input signal; and a main buffer unit which receives the input signal from the pre buffer unit and outputs an interface output with a slew rate controlled by the slew rate control unit;

wherein said slew rate control unit comprises:

an external terminal resistance;

a first comparator which compares a voltage dropped by the external terminal resistance with a predetermined reference voltage;

a slew rate control macro which generates and outputs a slew rate code based on a comparison result of the first comparator; and a first transistor which changes its own electrical characteristics according to the slew rate code, wherein the slew rate control macro compares the currently generated slew rate code with the previous slew rate code generated immediately before the currently generated slew rate code, and outputs a smaller one of the slew rate codes, and wherein a constant current value is autonomously determined so that the voltage dropped by the external terminal resistance becomes equal to the predetermined reference voltage, by repeating the output operation of the slew rate code and the changing of the electrical characteristics of the first transistor.

2. The slew rate adjusting circuit of claim 1, wherein the main buffer unit comprises a differential output interface providing an inverted output and a non-inverted output, and the pre buffer unit comprises a one-shot pulse unit including a second transistor which is capable of changing its own electrical characteristics according to a given cross point adjusting code, and wherein the slew rate adjusting circuit further comprises a cross point adjusting unit which generates the cross point adjusting code from the inverted output and the non-inverted output.

3. The slew rate adjusting circuit of claim 2, wherein the cross point adjusting unit comprises:

a second comparator which compares a voltage of the non-inverted output with a predetermined reference voltage;

a third comparator which compares a voltage of the inverted output with a predetermined reference voltage; and a cross point adjusting macro which generates the cross point adjusting code based on comparison results of the second comparator and the third comparator, and outputs the cross point adjusting code.

4. The slew rate adjusting circuit of claim 3, wherein the cross point adjusting macro compares the currently generated cross point adjusting code with the previous cross point adjusting code generated immediately before the currently generated cross point adjusting code, and outputs a smaller cross point adjusting code, and wherein a cross point of the inverted output and the non-inverted output is adjusted by repeating the output operation of the cross point adjusting code and the changing of the electrical characteristics of the second transistor.

5. A method of adjusting a slew rate comprising the steps of:

receiving, at a pre buffer unit, an input signal;

determining a current value of a current provided to the pre buffer unit and automatically controlling a slew rate of the input signal; and receiving the input signal from the pre buffer unit, and outputting an interface output at the controlled slew rate in response to inputting of the input signal;

wherein the step of controlling the slew rate comprises the sub steps of:

comparing a voltage dropped by an external terminal resistance in a circuit with a predetermined reference voltage;

generating a slew rate code based on a result of the comparing step, and outputting the generated slew rate; and providing the slew rate to a transistor which is capable of changing its own electrical characteristics according to the slew rate code, wherein the sub step of generating and outputting the slew rate code compares the currently generated slew rate code with the previous slew rate code which is generated immediately before the currently generated slew rate code, and outputs a smaller slew rate code, and a constant current value is determined autonomously so that the voltage dropped by an external terminal resistance becomes equal to the predetermined reference voltage, by repeating the output operation of the slew rate code and the changing of the electrical characteristics of the transistor.

* * * * *